US009588181B2

(12) United States Patent
Nortman et al.

(10) Patent No.: US 9,588,181 B2
(45) Date of Patent: Mar. 7, 2017

(54) ELECTROCHEMICAL CELL MONITORING AND BALANCING CIRCUIT WITH SELF-DIAGNOSTIC FEATURE

(71) Applicant: Coda Energy Holdings LLC, Monrovia, CA (US)

(72) Inventors: Peter Fredrick Nortman, Monrovia, CA (US); Daniel A. Sufrin-Disler, Duarte, CA (US); Phillip John Weicker, Pasadena, CA (US); Patrick J. Mcgulpin, Ontario, CA (US)

( * ) Notice: Subject to any disclaimer, the term of this patent is extended or adjusted under 35 U.S.C. 154(b) by 0 days.

(21) Appl. No.: 14/669,272

(22) Filed: Mar. 26, 2015

(65) Prior Publication Data
US 2015/0200552 A1    Jul. 16, 2015

Related U.S. Application Data

(62) Division of application No. 13/312,025, filed on Dec. 6, 2011.
(Continued)

(51) Int. Cl.
*H02J 7/00* (2006.01)
*G01R 31/36* (2006.01)
(Continued)

(52) U.S. Cl.
CPC ........ *G01R 31/362* (2013.01); *B60L 11/1866* (2013.01); *G01R 31/3606* (2013.01);
(Continued)

(58) Field of Classification Search
USPC .................. 320/106, 118, 132, 134, 145, 165
See application file for complete search history.

(56) References Cited

U.S. PATENT DOCUMENTS

| 5,608,306 A | 3/1997 | Rybeck et al. |
| 5,818,201 A | 10/1998 | Stockstad et al. |

(Continued)

FOREIGN PATENT DOCUMENTS

| CN | 1163500 A | 10/1997 |
| CN | 1214555 A | 4/1999 |

(Continued)

OTHER PUBLICATIONS

International Search Report and Written Opinion for International Application No. PCT/US2011/063507 dated Jul. 11, 2012.
(Continued)

*Primary Examiner* — Brian Ngo
(74) *Attorney, Agent, or Firm* — Wolf, Greenfield & Sacks, P.C.

(57) ABSTRACT

A system and method for measuring a voltage of electrochemical cells of a pack. The system includes circuit elements individually associated with respective electrochemical cells of the pack and having electrical characteristics that are different such that individual electrochemical cells can be distinguished from one another. The system also includes a measurement circuit configured to measure the voltage of the electrochemical cells and to identify an electrochemical cell being measured based on an electrical characteristic of a circuit element associated with the electrochemical cell. Various self-diagnostic techniques are described, as well as techniques for measuring sense resistance, reducing sense resistance, and measuring changes in voltage of a cell over time.

2 Claims, 7 Drawing Sheets

Related U.S. Application Data

(60) Provisional application No. 61/420,261, filed on Dec. 6, 2010, provisional application No. 61/420,259, filed on Dec. 6, 2010, provisional application No. 61/420,264, filed on Dec. 6, 2010.

(51) Int. Cl.
*H02J 9/00* (2006.01)
*B60L 11/18* (2006.01)
*H01M 10/48* (2006.01)

(52) U.S. Cl.
CPC ........ *G01R 31/3658* (2013.01); *H01M 10/48* (2013.01); *H02J 7/0014* (2013.01); *H02J 7/0016* (2013.01); *H02J 7/0075* (2013.01); *H02J 9/002* (2013.01); *B60L 2240/547* (2013.01); *B60L 2240/549* (2013.01); *B60L 2240/80* (2013.01); *Y02T 10/7005* (2013.01); *Y02T 10/7055* (2013.01); *Y02T 10/7061* (2013.01); *Y02T 10/92* (2013.01)

(56) References Cited

U.S. PATENT DOCUMENTS

| | | | |
|---|---|---|---|
| 6,043,628 A | 3/2000 | Perelle et al. | |
| 7,560,900 B2 * | 7/2009 | Cherng | H01M 10/052 320/134 |
| 2005/0024015 A1 * | 2/2005 | Houldsworth | H02J 7/0016 320/119 |
| 2007/0152637 A1 | 7/2007 | Cherng et al. | |
| 2007/0285058 A1 * | 12/2007 | Kuroda | H02J 7/0016 320/118 |
| 2007/0296376 A1 | 12/2007 | Marquet et al. | |
| 2008/0088277 A1 * | 4/2008 | Wang | H02J 7/0016 320/119 |
| 2009/0315514 A1 * | 12/2009 | Lee | H02J 7/0016 320/116 |
| 2010/0013430 A1 * | 1/2010 | Manor | H02J 7/0016 320/106 |
| 2010/0033135 A1 * | 2/2010 | Nishida | B60L 3/0046 320/136 |
| 2010/0085009 A1 * | 4/2010 | Kang | H01M 10/482 320/118 |
| 2010/0090653 A1 * | 4/2010 | Kuwano | H01M 10/482 320/136 |
| 2010/0231162 A1 | 9/2010 | Gibson et al. | |
| 2010/0237829 A1 * | 9/2010 | Tatebayashi | H01M 4/661 320/118 |

FOREIGN PATENT DOCUMENTS

| | | |
|---|---|---|
| CN | 1533627 A | 9/2004 |
| CN | 101123362 A | 2/2008 |
| CN | 101202463 A | 6/2008 |
| JP | 2000-348780 A | 12/2000 |
| JP | 2005-116342 A | 4/2005 |
| JP | 3829391 B2 | 10/2006 |
| JP | 2009-004319 A | 1/2009 |
| JP | 2010-183831 A | 8/2010 |
| WO | WO 92-06525 A2 | 4/1992 |

OTHER PUBLICATIONS

International Search Report and Written Opinion for International Application No. PCT/US2011/063523 dated Jul. 31, 2012.
International Search Report and Written Opinion for International Application No. PCT/US2011/032055 dated Oct. 13, 2011.
Office Action for Chinese Application No. CN201180003405.5 dated Apr. 2, 2014.

* cited by examiner

ELECTROCHEMICAL CELL MONITORING AND BALANCING CIRCUIT WITH SELF-DIAGNOSTIC FEATURE

RELATED APPLICATIONS

This application is a divisional of U.S. application Ser. No. 13/312,025, filed Dec. 6, 2011, titled "ELECTROCHEMICAL CELL MONITORING AND BALANCING CIRCUIT WITH SELF-DIAGNOSTIC FEATURE," which claims the benefit under 35 U.S.C. 119(e) of U.S. Provisional Application No. 61/420,259, filed Dec. 6, 2010, titled "ELECTROCHEMICAL CELL MONITORING AND BALANCING CIRCUIT WITH SELF-DIAGNOSTIC FEATURE," U.S. Provisional Application No. 61/420,261, filed Dec. 6, 2010, titled "ELECTROCHEMICAL CELL BALANCING CIRCUITS AND METHODS," and U.S. Provisional Application No. 61/420,264, filed Dec. 6, 2010, titled "SYSTEM AND METHOD FOR MEASURING ISOLATED HIGH VOLTAGE AND DETECTING ISOLATION BREAKDOWN WITH MEASURES FOR SELF-DETECTION OF CIRCUIT FAULTS," each of which is hereby incorporated by reference in its entirety.

TECHNICAL FIELD

Described herein are methods and systems for charging and discharging of electrochemical cells and, more specifically, to methods and systems for monitoring and managing the charging and discharging of electrochemical cells.

BACKGROUND

The need for monitoring and managing large arrangements of electrochemical energy storage cells for various applications is known. Systems for performing such monitoring and management typically include features such as voltage measurement, temperature measurement and battery cell balancing (i.e. equalization) either through selective cell dissipative discharging or charge redistribution. Of particular interest are large-scale systems used for storing electrical energy for the propulsion of vehicles as well as energy storage systems for electrical grid support and supplying power to remote locations.

Various methods exist for attempting to verify the measurement data by examining its content to determine the plausibility of the information gathered. One method is to compare the sum of the cell voltages to the pack voltage. However, this method needs extremely accurate measurements. A 200 mV error might seem very small for a pack voltage, while it can be very large for a cell voltage. Other methods include checking the ranges of the measurements of the cells to ensure that they seem reasonable. This technique could catch issues where a reading is low enough or high enough to be unreasonable, but would not catch any errors in which a cell reading is replaced by a different cell's reading. Moreover, modern batteries have an increasingly minimal change in cell voltage as a function of depth of discharge, meaning that it is quite normal that a number of cells will appear to be (within the precision of the measurement system) at the same voltage over a large range of a system's lifetime.

A second method is known in the art, which suggests using two redundant measurement systems. However, this method may add significant cost to the monitoring solution.

Due to the architecture of a number of measuring circuits, there is often a great deal of shared componentry used to measure a number of cell voltages or temperatures. This is done to reduce the cost associated with large numbers of highly accurate components that a lack of sharing would impose, especially when a system contains a high number of cells.

Most large-format battery systems operated over a long period of time require cell balancing. This can be accomplished by selective cell charging, selective cell discharging, charge shuttling, or combinations of the above. A number of methods exist for these strategies.

SUMMARY

Using the systems or methods described herein, cells of a battery pack may be identified and faults within measurement, selection and/or balancing circuitry for a battery pack may be detected.

Some embodiments relate to a system for measuring a voltage of electrochemical cells of a pack. The system includes circuit elements individually associated with respective electrochemical cells of the pack and having electrical characteristics that are different such that individual electrochemical cells can be distinguished from one another. The system also includes a measurement circuit configured to measure the voltage of the electrochemical cells and to identify an electrochemical cell being measured based on an electrical characteristic of a circuit element associated with the electrochemical cell.

Some embodiments relate to a method of monitoring an electrochemical cell of a pack comprising a plurality of electrochemical cells. The method includes measuring a voltage of the electrochemical cell and identifying the electrochemical cell from among the plurality of electrochemical cells based on an electrical characteristic of a circuit element connected to the electrochemical cell.

Some embodiments relate to a system for monitoring and balancing electrochemical cells of a pack. The system includes a balancing circuit configured to charge or discharge a first electrochemical cell of the pack. The balancing circuit is configured to generate a current through the first electrochemical cell. The system also includes a measurement circuit connected to the first electrochemical cell, the measurement circuit being configured to measure, based on the current, a sense resistance established by coupling the first measurement circuit to the first electrochemical cell.

Some embodiments relate to a system for monitoring electrochemical cells of a pack. The system includes a measurement circuit connected to a first electrochemical cell of the pack and a current generating circuit configured to generate a wetting current through the first electrochemical cell of sufficient magnitude to wet a contact between conductors coupling the measurement circuit to the first electrochemical cell.

Some embodiments relate to a method of monitoring an electrochemical cell. The method includes measuring a change in voltage over a time period as the electrochemical cell charges or discharges and determining, based at least partially on the change in the voltage over the time period, a range of the state of charge of the electrochemical cell.

Some embodiments relate to a system for monitoring an electrochemical cell. The system includes a measurement circuit configured to measure a change in voltage over a time period as the electrochemical cell charges or discharges. The system also includes a controller configured to determine, based at least partially on the change in the voltage over the time period, a range of the state of charge of the electrochemical cell.

The foregoing summary is provided by way of illustration and is not intended to be limiting.

DETAILED DESCRIPTION

Described herein are techniques and circuits for monitoring battery cells than can include the capability of diagnosing malfunctions with the battery measurement system or battery balancing system. Such circuits and techniques can verify that measurements are indeed from the intended cells, and can verify that the balancing circuit is operating as intended.

Figure 1:
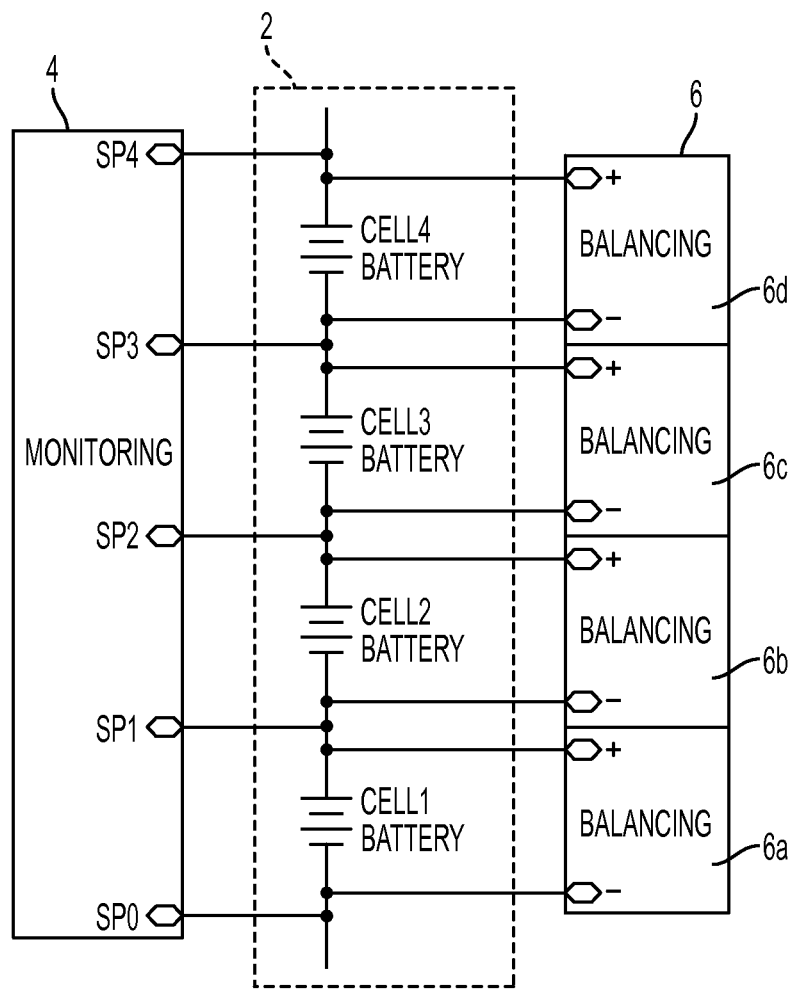
FIG. 1 shows an exemplary battery monitoring and balancing system.

An exemplary battery monitoring and balancing system will be described with reference to FIG. 1. FIG. 1 shows an exemplary battery monitoring and balancing system connected to a battery pack 2. As shown in FIG. 1, the battery pack 2 may include a plurality of electrochemical cells, CELL1, CELL2, CELL3, and CELL4. Although only four cells are shown in FIG. 1, it should be appreciated that a battery pack such as battery pack 2 may have any suitable number of cells. The cells of battery pack 2 may be connected in any suitable manner, such as in series, in parallel, or any suitable combination thereof. The number and/or topology of cells in battery pack 2 may be selected based on the voltage, current and/or battery capacity desired for a particular application. Exemplary applications for the battery pack 2 include electric vehicles, hybrid vehicles, or grid-tied energy storage systems. However, the techniques and circuits described herein are not limited to use in vehicles or grid-tied energy storage systems, as they may be applied to any suitable application.

The battery monitoring and balancing system shown in FIG. 1 includes a monitoring system 4 connected to the plurality of electrochemical cells in the battery pack 2. The monitoring system 4 may be any suitable monitoring system of having any of a variety of topologies, including, but not limited to switched capacitor, multiplexer, switches connected to an analog-to-digital converter (ADC), or combined multi-level topologies of multiplexers in front of switches. The monitoring system 4 may have a first terminal connected to the positive terminal of each cell and a second terminal connected to the negative terminal of each cell. For example, as shown in FIG. 1, terminal SP0 of the monitoring system 4 is connected to the negative terminal of CELL1 and terminal SP1 of the monitoring system 4 is connected to the positive terminal of CELL1. Terminal SP1 of the monitoring system 4 is connected to the negative terminal of CELL2 and terminal SP2 of the monitoring system 4 is connected to the positive terminal of CELL2. Terminal SP2 is connected to the negative terminal of CELL3 and terminal SP3 is connected to the positive terminal of CELL3. Terminal SP3 is connected to the negative terminal of CELL4 and terminal SP4 is connected to the positive terminal of CELL4. A selected cell or group of cells can be monitored by selecting the appropriate terminals of monitoring system 4 at which to receive input. For example, terminals SP0 and SP1 can be used to monitor CELL1. Such monitoring may include measuring the voltage of CELL1 and/or the current through CELL1. As another example, the voltage and/or current of the entire battery pack 2 can be measured using terminals SP0 and SP4. The monitoring system 4 may select any suitable cell or combination of cells in battery pack 2 for monitoring. Monitoring system 4 may perform a sequence of measurements of different cells and/or combinations of cells in accordance with a monitoring program executed by a controller.

Figure 6:
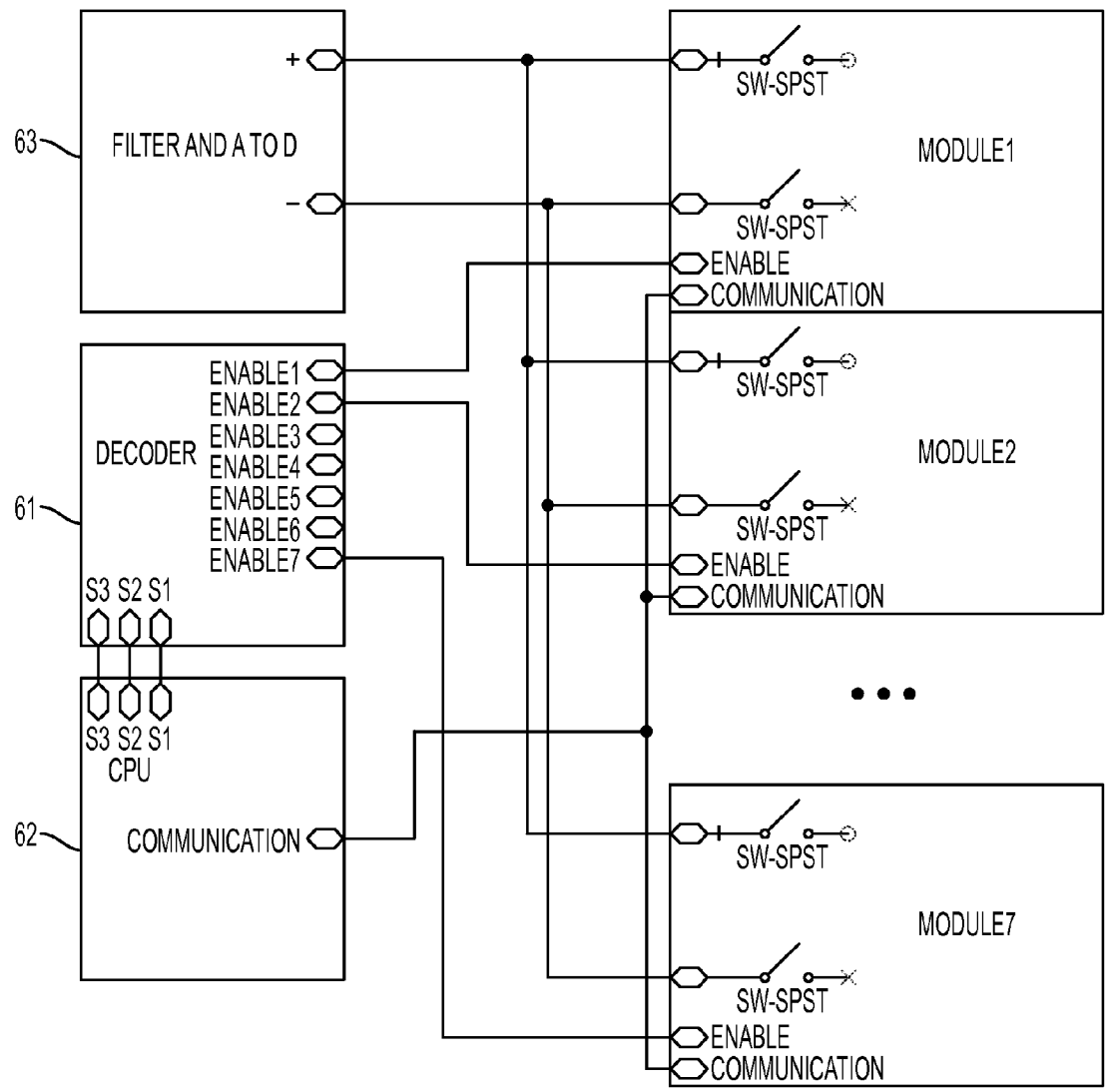
FIG. 6 shows an embodiment in which seven modules are connected together to form a device capable of measuring twenty-eight cells.

The battery monitoring and balancing system shown in FIG. 1 also includes a balancing system 6 for charging and/or discharging the cells of battery pack 2. The balancing system 6 may be configured to maintain the cells of the battery pack 2 at a suitable voltage and/or charge level to prolong their usable life (e.g., by avoiding over-charging or over-discharging cells). Balancing system 6 may be configured to perform such balancing in response to a balancing program executed by a controller. The balancing system 6 may be any suitable balancing system of any of a variety of topologies, including, but not limited to switches to a shared discharge or charge circuit, a switched-in bleeding resistor, a switched charge/discharge current source, a charge/discharge current source that can be set to zero current, or switches to a voltage source. The balancing system 6 includes a plurality of balancing circuits 6a, 6b, 6d and 6d each associated with a respective cell of the battery pack 2. As shown in FIG. 6, balancing circuit 6a is connected to CELL1, balancing circuit 6b is connected to CELL2, balancing circuit 6c is connected to CELL3, and balancing circuit 6d is connected to CELL4. The positive terminal of each balancing circuit is connected to the positive terminal of the associated cell and the negative terminal is connected to the negative terminal of the associated cell.

In the battery monitoring and balancing system shown in FIG. 1, the monitoring system 4 has connections to the battery pack 2 that are different from the connections of the balancing system 6 to the battery pack 2. In an alternative arrangement, the monitoring system and balancing system may share connections to the battery pack 2.

Various problems can occur with such battery monitoring and balancing systems. For example, the circuitry within monitoring system 4 that selects which cell(s) to measure may malfunction, which may cause a different cell to be measured than the cell that had been selected for measurement. For example, if CELL1 has been selected for measurement, a malfunction in the circuitry used to select which cell(s) to measure may cause another cell to be selected for measurement, such as CELL3, for example. As a result, the monitoring system 4 may be unable to make a measurement of CELL1, and, as a result, would not be able to detect a problem with CELL1. The monitoring system may not be able to determine whether CELL1 is being measured, as desired, or if another cell is erroneously being measured in its place.

Another potential problem is that the balancing system 6 may have a malfunction in the circuitry that activates balancing of a selected cell such that the wrong cell is activated for balancing. As a result, the cell that was selected for balancing may have a voltage that is too high or too low, and the cell that is erroneously activated for balancing may be charged or discharged when it is not appropriate to do so, potentially imbalancing the pack, damaging these cells or reducing their lifespan.

Another potential problem is that a balancing circuit for a cell may be stuck in the on state, continually charging or discharging the cell, or stuck in the off state, and unable to charge/discharge the cell.

It would be desirable to reduce or eliminate one or more of these problems to improve battery reliability.

Figure 2:
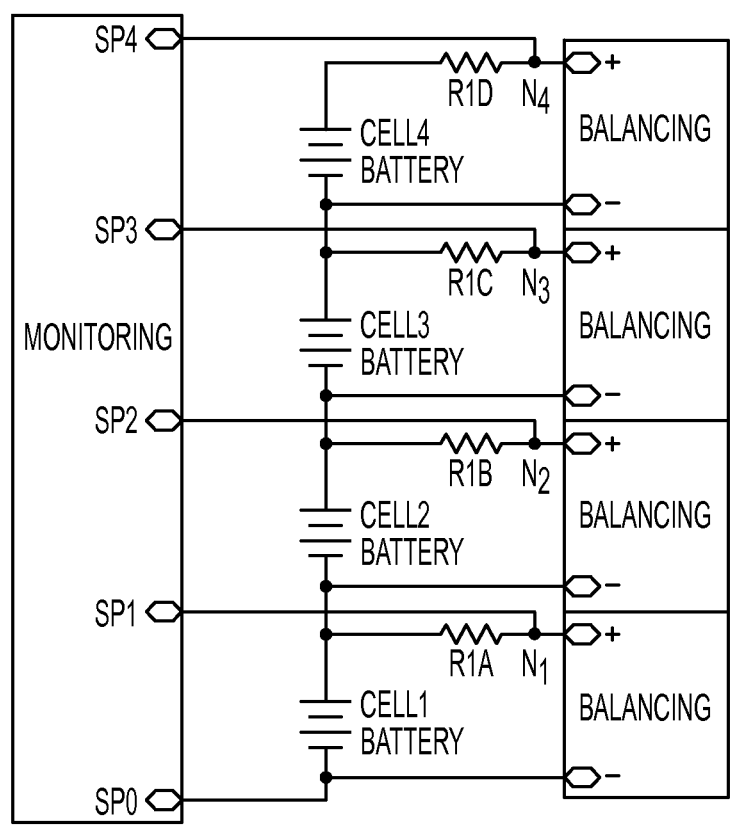
FIG. 2 shows a schematic of an embodiment of a battery monitoring and balancing system including resistors in series with each cell which may have different values to differentiate cells from one another.

In some embodiments, circuit elements having different characteristics may be individually associated with each cell of the battery pack 2 to enable discriminating cells from one another, which can allow verification that the cell being measured is the cell that has been selected for measurement. In one embodiment, as shown in FIG. 2, each cell is connected in series with a resistive element (e.g., a resistor). Measurements of the cell voltage may be made across the series combination of the cell and the resistor. In one aspect, the resistive elements associated with the cells may have different values, which allows identifying that the cell being measured is the cell that had been selected for measurement.

FIG. 2 shows a schematic illustrating an embodiment in which resistors are connected in series with each cell of battery pack 2. As shown in FIG. 2, a first terminal of a resistor is connected to the cell and the second terminal of the resistor is at a measurement node $N_i$ for the cell. Both the balancing module associated with the cell and the measurement system 4 may be connected to the second terminal of the resistive element at the measurement node $N_i$. For example, as shown in FIG. 2, resistor R1A is connected in series with CELL1, resistor R1B is connected in series with CELL2, resistor R1C is connected in series with CELL3, and resistor R1D is connected in series with CELL4. Both the positive terminal of balancing module 6a and the terminal SP1 of the measurement system 4 are connected to measurement node $N_1$. The negative terminal of the balancing module 6a and terminal SP0 of the measurement system 4 are connected to the negative terminal of CELL1. A similar configuration is used for the other cells, as shown in FIG. 2. The monitoring system 4 may measure the voltage for CELL1 as the voltage between SP0 and SP1, the voltage for CELL2 as the voltage between SP1 and SP2, the voltage for CELL3 as the voltage between SP2 and SP3 and the voltage for CELL4 as the voltage between SP3 and SP4.

In some embodiments, measurements may be made with balancing turned on, with current flowing through the series combination of the cell and the resistor, and also with balancing turned off. Such a technique enables detecting a malfunction in the balancing system 6.

When the balancing module is disabled, such that the current from the balancing module is zero, the voltages measured between any given set of sense points SP0 to SP1, SP1 to SP2, SP2 to SP3, or SP3 to SP4 is the same voltage as measured across the cells Cell1, Cell2, Cell2 or Cell4, respectively, as long as the measurement system 4 draws low current. In order to measure the actual voltage on any cell, the balancing circuit may be temporarily disabled both for that cell and the cell below it so that there are no voltage drops on either resistor on either side of the cell to be measured. For example, if the voltage across CELL2 is being measured, balancing circuits 6a and 6b may be disabled so there will be negligible or zero current flowing through resistors R1A and R1B. As a result, the voltage across resistors R1A and R1B will be zero, and the voltage measured across terminals SP1 and SP2 will be equal to the cell voltage.

In order to perform self-diagnosis, a measurement can be made with the balancing module off, and a second measurement can be made with the balancing module on. If the two measurements are equal, the difference in current flowing through the balancing circuit can be deduced to be zero, and the balancing circuit may therefore be permanently enabled or permanently disabled.

As discussed above, the resistors R1A, R1B, R1C and R1D may have different values to enable identifying the cell being measured as the cell that had been selected for measurement. Alternatively, the resistors R1A, R1B, R1C and R1D may have the same resistance values in some implementations. For example, the same resistance values may be used in an implementation where identification of individual cells is not necessary.

To verify that all measurements are from the intended cells, the values of the resistors R1A, R1B, R1C, R1D may be selected to be different enough to enable the system's software algorithm to determine which resistor (and, therefore, which cell) is being detected. If the balancing current to the cell is known, the voltage with balancing enabled can be compared to the voltage with balancing disabled as a ratio or an expected difference. If the difference or ratio is different than expected, it can be presumed that the intended cell is not being monitored, or that the sense resistance is out of specification and a fault condition can be communicated and/or other action taken.

Although resistors R1A-R1D are shown in FIG. 2 as being connected to the positive terminals of the cells, other configurations are possible. For example, the resistors R1A-R1D may be connected to the negative terminals of the cells. More than one resistor per cell may be used, in some implementations. This could require disabling balancing of the cell above the one being measured when making a measurement.

There are several methods and configurations that can be utilized to use the different sensed values to ensure that all cells are being measured, based (at least in part) on the level of shared circuitry involved in selecting the cell to measure, and selecting which cells to balance.

Case 1: Completely Independent Selection Circuitry for the Monitoring System and Balancing System.

When the monitoring system and the balancing system make separate selections of the cells, any failure in the circuitry used to select which cell to measure would have no effect on any circuitry used to select which cells to balance, and vice versa. No common select lines or other shared circuitry are present. In this case, a single value of R1 could be used for all cells. When the system is selecting a given cell i to measure (where i is from 1 to N), and selecting the same cell i to balance, the following cases of normal operation and single point failures are possible.

A. Cell i is still being measured but a different cell x (x≠i) has been selected for balancing.
B. Cell i is stuck balancing, and cell i is being measured.
C. Cell i is stuck not balancing, and cell i is being measured.
D. Cell i balances correctly, but cell i is not being measured, instead the monitoring system is broken and is measuring a different cell x (x≠i)
E. Cell i balances correctly, and cell i is measured correctly (no fault with the circuit)

Under all cases A through D, if a single value of R1 is being used, the failure will be detected as follows.

A. For "A", above, the same voltage is read on cell i (i.e., the value without balancing) while a different cell other than i, x has balancing turned on and off; the lack of voltage change for cell i indicates a fault condition.
B. For "B", above, the same voltage is read (a balancing stuck on value) in both cases on cell i, indicating a fault condition
C. For "C", above, the same voltage is read (the non-balancing value) in both cases on cell i, indicating a fault condition.
D. For "D" above, a the non balancing value for cell x is read both when cell i is balancing and when cell i is not balancing. Reading the same value twice indicates a fault condition.
E. In E (no failure), a different value is read when balancing versus not balancing showing proper operation of the circuits.

When the circuitry used to select the cell to measure is completely independent of the cell balancing circuitry, a single resistor value can be used to ensure that balancing works correctly and that cell monitoring system 4 is measuring the correct cells.

As a further tool for detection, if cell i is being measured, but cell i−1 is balancing instead of cell i, this could increase the voltage reading on cell i. This condition can be detected if the voltage reading on cell i actually increases when attempting to balance i.

Case 2: Completely or Partially Dependent Circuitry Between the Monitoring and Balancing Systems.

In this case, the same circuits used to select a cell to measure are also used to select the cell to balance. For example, if the control system uses shared select binary signals, and when cell i is selected for measurement, the control system can also turn the balancing of cell i on or off. Once the control system is done measuring cell i, it can continue balancing as commanded until the next time cell i is selected for measurement. With this architecture, a failure causing a cell other than cell i to be measured may cause the measured cell, rather than cell i to be selected for balancing. Going through the same possibilities as above:
A. a different cell x (x≠i) is selected for balancing, by virtue of the shared circuitry, a different cell also x (x≠i) is also selected for measuring,
B. Cell i is unable to stop balancing, and cell i is being measured,
C. cell i is unable to balance, and cell i is being measured,
D. Cell i balances correctly, and cell i is measured correctly (no fault with the circuit).

A single value for R1 would not be able to detect the difference between scenario A and scenario D. Multiple values of R1 may be needed in this case to allow differentiating scenario A from scenario D.

If multiple values of R1 are used:
A) For "A" above, two voltages are read, (the non-balancing value and the balancing value) for a cell x. If the resistor R1 on cell x is different than the resistor R1 on cell i, The calculated value of R1 will be incorrect, and this is a detectable error. If Cell i, and Cell x both have the same value for R1 this would not be detected.

Note, if cell i, and cell x have the same value of R1, and the system is properly designed, whatever failure has caused cell x to be selected and balanced instead of cell i, will cause more cells to also be incorrectly selected. The system will locate the failure as long as one of the interchanged sets of cells has different values for R1. This will be examined in further detail below.

B) For "B", above, the same voltage is read (balancing value) in both cases on cell i. This is a detectable error. Note: The software may not know if this is a balancing or a non balancing value, just that if the two readings are the same, there is an error.
C) The same voltage is read (the non-balancing value) in both cases on cell i. This is a detectable error.
D) A different value is read (both balancing and non-balancing values) on cell i, and the ratio between the values or the difference indicates that the value of R1 is correct. This indicates that there is no error and the correct cell is being balanced and measured.

Thus, different values for the R1 resistors may be used to ensure that every cell is being measured if there is shared circuitry between the signals used to select the cell for measurement and the signals used to select cells for balancing. The number of values needed depends on the type of failures that are possible based on the selection architecture.

The most common types of failures to detect are when select lines are stuck high or stuck low. If an architecture has an individual select line for every cell being measured, most common failures involve a cell that is never selected (resulting in a reading of 0), or a cell that is always selected (detectable by unsuccessfully trying to make a null measurement).

In some architectures, multiplexers and demultiplexers are used so that the controller can use fewer outputs to select which cell to measure. In this case, a failure of a binary select signal which outputs a continuous logic high or logic low would result in several measurements being made incorrectly.

For example, consider the following table, describing a system using a 16-to-1 multiplexer to select a cell for measurement with four digital select lines, S1, S2, S3 and S4. The value of the R1 (see FIG. 2) resistor for each cell can be selected from one of two values: Value1, Value2. It will be shown that by differentiating only a few of the possible cells, any failure of a single line stuck high or a single line stuck low can be detected. In this particular embodiment, if the resistor chosen for R1 on cell 1 is different from the R1 chosen for cells 2,3,5 and 9, failures of a select line can be detected.

| S4 | S3 | S2 | S1 | Selected Cell | R1 Value |
|----|----|----|----|---------------|----------|
| 0  | 0  | 0  | 0  | 1             | 1        |
| 0  | 0  | 0  | 1  | 2             | 2        |
| 0  | 0  | 1  | 0  | 3             | 2        |
| 0  | 1  | 0  | 0  | 5             | 2        |
| 1  | 0  | 0  | 0  | 9             | 2        |

S4 through S1 are select lines selecting from one of 16 cells. Resistor selected can be value 1, or value 2. There are 8 failures for the select lines being failed in the high or low states:

S4 Failed high: When trying to select cell 1, cell 9 is selected. Resistor 2 is seen instead of 1.
S4 failed low. When trying to select cell 9, Cell 1 is selected. Resistor 1 is seen instead of 2.
S3 failed high: When trying to select cell 1, cell 5 is selected. Resistor 2 is seen instead of 1.
S3 failed low: When trying to select cell 5, cell 1 is selected. Resistor 1 is seen instead of 2.
S2 failed low: When trying to select cell 1, cell 3 is selected. Resistor 2 is seen instead of 1.
S2 failed low: When trying to select cell 3, cell 1 is selected. Resistor 1 is seen instead of 2.

S1 failed low: When trying to select cell 1, cell 2 is selected. Resistor 2 is seen instead of 1.

S1 failed low: When trying to select cell 2, cell 1 is selected. Resistor 1 is seen instead of 2.

In general, two different resistor values will be sufficient to ensure that no select line is stuck high or stuck low. The value of R1 on cells other than 1, 2, 3, 5 and 9 is not significant because any failure of a select line will be caught when trying to measure cells 1, 2, 3, 5 and 9. As long as all cells see a difference between the case where balancing is on and balancing is off, and there is a different resistance value for CELL1 versus the values on cells 2, 3, 5 and 9, any line stuck balancing, stuck not balancing, or a select line failure will be caught. More resistance values can be used which can yield greater detail about failures as desired, or can protect from more complicated failures such as adjacent select lines being stuck together.

Another type of fault occurs where two select lines are stuck together. For example, for a few different faults, the table below shows the desired cell to measure and the cell actually being measured.

| Desired Cell | Cell being measured with S4 stuck high | Possible Cell being measured with S1 tied to S2 (S1 dominating) | Cell being measured with S1 tied to S2 (S2 dominating) |
|---|---|---|---|
| 1 | 9 | 1 | 1 |
| 2 | 10 | 4 | 1 |
| 3 | 11 | 1 | 4 |
| 4 | 12 | 4 | 4 |
| 5 | 13 | 5 | 5 |
| 6 | 14 | 8 | 5 |
| 7 | 15 | 5 | 8 |
| 8 | 16 | 8 | 8 |
| 9 | 9 | 9 | 9 |
| 10 | 10 | 12 | 9 |
| 11 | 11 | 9 | 12 |
| 12 | 12 | 12 | 12 |
| 13 | 13 | 13 | 13 |
| 14 | 14 | 16 | 13 |
| 15 | 15 | 13 | 16 |
| 16 | 16 | 16 | 16 |

In order to detect failures of multiple lines stuck together, there will need to be sufficient values of R1 distributed in a manner so that for any given detectable failure, a sequence of measurements for every cell with everything working properly will be different than a sequence of measurements with any given failure. Note, if S1 and S2 are stuck together, in addition to S1 dominating, or S2 dominating, whichever bit is low could dominate, or whichever bit is high could dominate.

When the product goes through a design failure mode analysis, an engineer can list the errors within the selection circuitry that must be detected, and an appropriate number of different values for R1 may be chosen to detect any failure.

If the hierarchy can be split up so that certain groups of select lines cannot be shorted to other select lines, fewer values of R1 may be used. For example, if it could be guaranteed that S4 and S3 could never interfere with S2 and S1, four values of R1 could be used. Cells 1 to 4 could be grouped together, Cells 5 to 8 could be grouped together, Cells 9 to 12 could be grouped together, and cells 13 to 16 could be grouped together. Within each group of four cells, four different value resistors would be used which would allow detection of any failures between the S2 and S1 lines. By placing the four chosen resistor in a different order for each group, any failures between S4 and S3 could be detected.

For example, in one embodiment, there are several cells grouped into sets of four cells in series called a module. There is selection circuitry within each module to select from one out of the four cells within the module to measure. There is than more selection circuitry to select which one of seven modules is connected to a measurement device. The hierarchy is thus split into two levels, on one level one out of four cells is chosen within a module, and on the main level one of seven modules is selected. Furthermore, the selection lines are on different integrated circuits and are segregated such that failures on the select lines for which module to select are completely independent of failures to select a cell within a module.

Details on How to Determine Which Resistance Value R1 is in the Circuit Based on Comparing the 2 Measured Values.

There are two general possibilities for balancing circuits which can be used to determine the value of R1.

Figure 3:
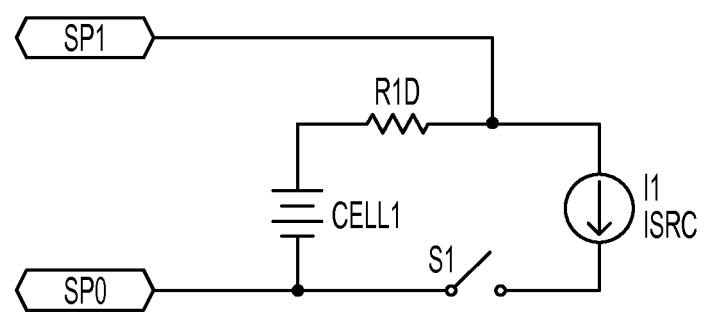
FIG. 3 shows a schematic of a circuit in which a current source charges or discharges a cell group through the series combination of a cell and a resistor.

Case 1 Constant Current Circuits:

The first possibility is a constant current source, as illustrated in FIG. 3.

Let $V_{Bal}$ be the voltage at the output between SP0 and SP1 with the current source on at a value of $I_{SRC}$, and let $V_{Cell}$ be the voltage value with the current source at 0, or disconnected by opening switch S1.

R1 can be selected from a set of unique, discrete and predetermined resistor values. For example, a given design may use four values, R1A, R1B, R1C, R1D.

R can be determined by: $(V\_bal - V\_Cell) = I_{SRC} R$. Furthermore, given that the ranges of I and R, as well as possible uncertainties in the measuring circuit, are known ahead of time, a range between two voltages $V_{Min\_R1D}$ and $V_{Max\_R1D}$ can be determined such that:

If $V_{Min\_R1D} <= V_{bal} - V_{Cell} <= V_{Max\_R1D}$, the resistor value is R1D. These ranges can be precalculated for the different selected values of R1, the tolerances on R1 and the ranges for the current source. Depending on the range/tolerance of the values of R1, the sensitivity of the voltage measurement and the range/tolerance of the current source, the different values of R1 will have to have values that are sufficiently different so that the ranges do not overlap.

This is equally valid in the case where the switch, S1, is a solid-state or semiconductor device which has a non-zero voltage (sometimes referred to as the saturation voltage) across it while it is closed, and/or a non-zero current through it while it is open (sometimes referred to as leakage current). The technique of worst-case circuit analysis, known to those skilled in the art, can be used to design the circuit and select component values to allow the resistor choice to be determined unambiguously.

Figure 4:
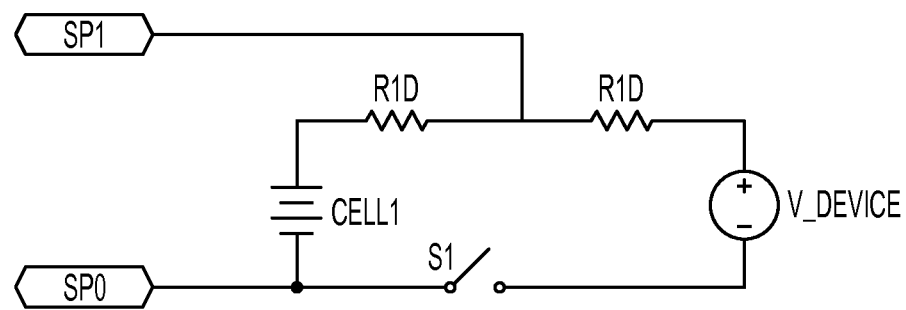
FIG. 4 shows a schematic of a circuit in which a voltage source is connected to charge or discharge a cell group.

Case 2 Constant Voltage Circuits:

The second possibility, as illustrated in FIG. 4, is two resistors being connected to a constant voltage source V_Device. These values are R1 and R2. The voltage source (V_Device) can represent any component that could be analyzed as a constant voltage source. For example, V_Device can be close to 0 V if a switch is used to connect the resistors to the negative of the cell, or V_Device can be a transistor voltage drop if using a transistor to connect R2 to the negative point of the cell, or V_Device could be a charging voltage source which is higher than the cell voltage which would charge up the cell through R2 and R1, finally V_Device could be a discharging constant voltage lower than the cell voltage such as series diodes designed to discharge the cell towards a discharge voltage.

In this case, R1 and R2 can be chosen to add up to a constant sum so that even with different values of R1, the total balancing resistance remains the same from cell to cell. The equations governing this situation are:

Let V_Cell be the voltage measured between SP0 and SP1 with S1 open which is also the voltage across Cell1

Let V_Bal be the voltage measured between SP0 and SP1 with S1 closed.

$$V\_bal - V\_Cell = I*R1.$$

$$I = (V\_Cell - V\_Device)/(R1+R2)$$

If I, V_Cell, V_device, and the tolerance for a given R1 and R2 vary little enough, and the chosen values of the different R1 resistors are far enough apart, ranges can be precalculated as with the first case. If the values vary too much (especially if V_Cell as it ranges from fully discharged to fully charged), the ranges can be calculated during system operation based on the measured V_Cell and known ranges for V_Out, R1 and R2.

Variations of Resistor-Based Circuits:

The added resistors from FIG. 2, R1A to R1D could be placed on either the positive or negative connection to the cells in question, and voltage or current sources could then be placed on the other side of the resistors. In order to check the function of the balancing, two readings are needed. For simplification, above an embodiment is described in which the current is nominally zero for one of the two readings (a non-balancing reading was compared with a balancing reading). However it is possible to determine if the correct value of the R1 resistor is connected without one of the two readings being with zero current. For example, if discharging the cells through a controllable discharge current source, one reading could be under a small discharge current, and the $2^{nd}$ reading could be under a heavier discharge current. Another example would be charging through a controllable voltage source with one reading set to a low charge voltage and the $2^{nd}$ reading set to a higher charge voltage. By comparing the difference between two readings under two different operating conditions, the value of R1 can be determined. In most cases one of the two readings would be under 0 current, but it is possible to make two readings both with different currents flowing through R1 and based on the difference in the currents to be able to determine R1.

Note, FIGS. 3 and 4 both show switches, but if a current source can be commanded to zero, or to multiple different values, or if the voltage source can be commanded to different values, a switch would not be needed to get the two different required readings to determine that R1 is within the required range.

Further Variations

Above has been described an embodiment in which resistive elements associated with each cell have different resistance values to enable identifying a cell that has been selected for measurement. In some embodiments, the cells may be discriminated from one another using a different technique. For example, each cell may be connected to a resonant circuit that is configured to resonate at a different frequency. When making a measurement of the cell, an AC signal may be applied to the cell, and an AC measurement may be made to identify whether the resonant circuit associated with the cell resonates at the expected frequency. Alternatively, each cell may be connected to a bandpass or bandstop filter that is configured to pass, or block, respectively, a different frequency range. In such a case, an AC measurement may be made to check the filter associated with a cell has expected frequency characteristics. In another example, a digital circuit may be associated with each cell having different characteristics, such as different stored digital values. Thus, various techniques may be used to discriminate cells from one another based on electrical characteristics. In such techniques, circuit elements can be individually associated with respective electrochemical cells of the pack and have electrical characteristics that are different enough such that individual electrochemical cells can be distinguished from one another. However, the techniques described herein are not limited to identifying cells electrically, as any other suitable technique can be used to identify cells.

EXAMPLE

The embodiment shown in FIG. 5 and FIG. 6 and is built on top of an architecture as follows: there is monitoring and balancing circuitry for twenty-eight cells. There are seven groups of four cells in series totaling the twenty-eight cells. The monitoring and balancing circuitry for four cells in series is called a module. Thus, there are seven modules each monitoring and balancing four cells.

Figure 5:
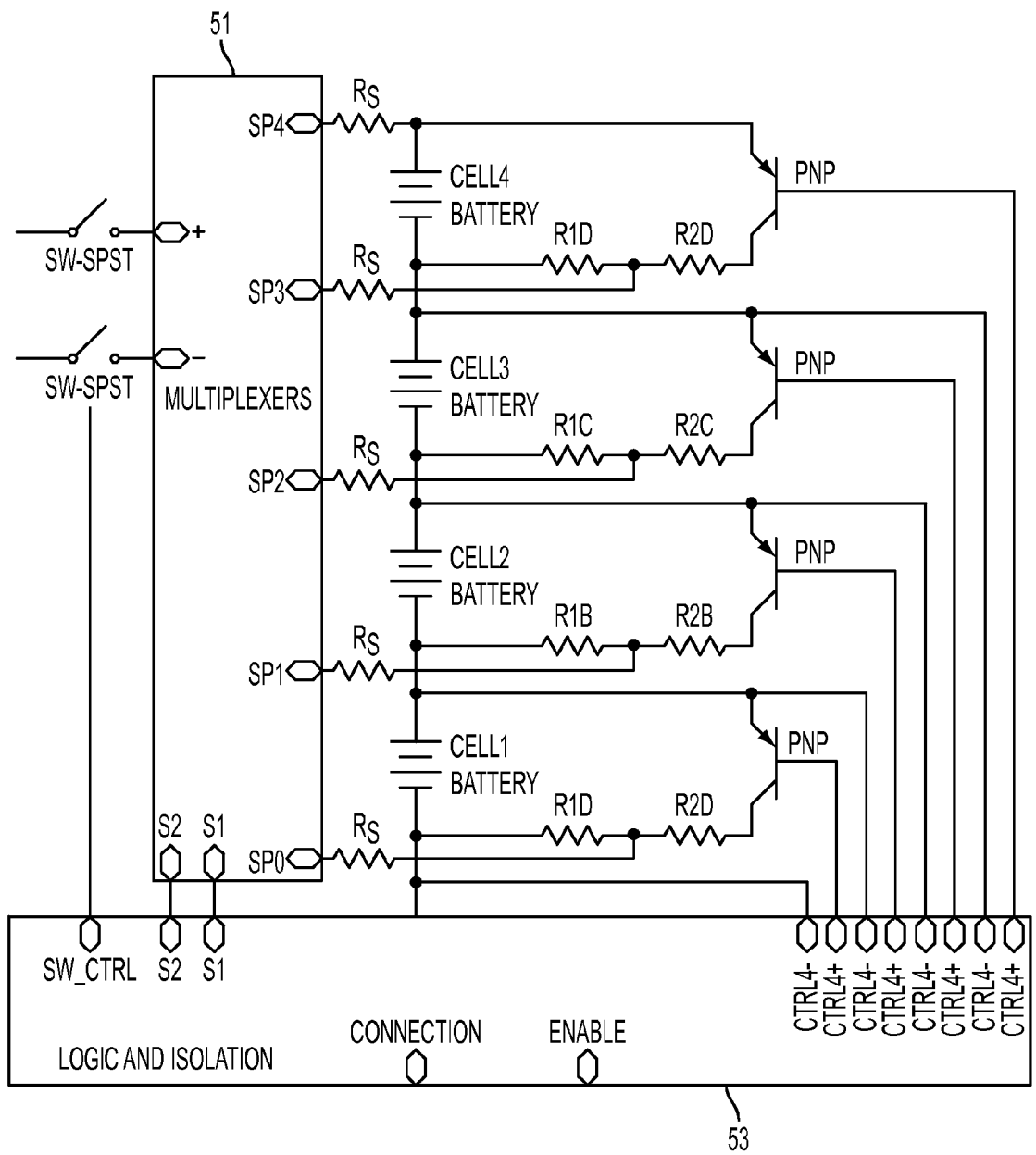
FIG. 5 shows a schematic of an embodiment in which bipolar transistors draw current from the cells.

As shown in FIG. 5, each module has multiplexers 51 to select between four cells, and serial digital data may be sent to each module to control the balance data and select lines for that module. The resistors R1 are connected to the negative terminals of the cells, there are four different values of R1. Each module may include a logic and isolation module 53 that may include logic to control the multiplexers to provide measurements to the measurement system and to control the balancing circuits, as well as circuitry to isolate the module. In this example, the balancing circuit for each cell includes a PNP transistor.

FIG. 5 shows one module for four cells, and FIG. 6 shows the connection of all seven modules together. FIG. 6 shows the seven modules connected together to make a device capable of measuring twenty-eight cells. There is a decoder/demultiplexer 61 which uses three select lines to select one of the 7 modules in response to commands from the controller 62 (which may have a CPU or other processor). The modules are selected when switches connect an ADC (analog-to-digital converter) and buffer circuit 63 of the measurement system to the module in question while all other modules are disconnected from the ADC.

Relating FIGS. 5 and 6 to FIG. 1, the multiplexers the switches, the filters and the ADC are all considered part of the monitoring system 4. The balancing PNP transistors and R2 resistors are part of the balancing system 6. The R1 resistors are the R1s listed in FIG. 1 for the self-check. The logic and isolation block 53 within each module, the controller 62 and the decoder 61 are all part of both the monitoring and balancing system.

The following failures may be detected:
1) Any failure of the select lines within a module (including stuck high, or stuck low or stuck together)
2) Any failure of a balancing transistor stuck on or stuck off.
3) Any failure of the select lines to the decoder. (including stuck high, or stuck low or stuck together)

Note: Decoder outputs stuck high or low, or switches stuck on or off are detected by using methods known to the art including zeroing the measurement circuitry between measurements and also by attempting to Null measurements with no modules connected.

Decoder outputs stuck high or low, or switches stuck on or off are detected by doing the following:

Measurements may be made when the decoder is selecting none of the modules. If a valid voltage is read, one of the modules is actually on either through a decoder pin stuck high fault, or through a switch stuck on fault, and a DTC will be set.

Also, measurements may be set to zero before connecting a module. If a voltage should make a valid reading but reports zero instead, a DTC is set which may indicate a decoder line stuck low, or a switch stuck off.

Items 1 and 2 from above may be detected as follows:

The resistor values R1 are set up so that each cell within a given module has a unique value of R1, selected from four values, R1_1, R1_2, R1_3, R1_4. This ensures that if select signals S1 and/or S2 within a module experience fault conditions, the fault within that module will be detected. The values of R1 and R2 associated with each cell add up to a constant value. Relating FIG. 5 to FIG. 4, the voltage source $V_{device}$ in FIG. 4 is the voltage drop of the PNP transistor in FIG. 5. This uses the constant voltage method of identifying the identification resistor.

The voltage output of the module is connected to a measurement device depending on the value of the SW_CTRL signal. Faults in the SW_CTRL signal must also be detected. This is done by ensuring that the ordering of the 4 different values of R1 is different within each module.

If the values of R1 are R1_1, R1_2, R1_3, R1_4, the following table shows one example of the sequencing to identify modules

| Resistors | Module 1 | Module 2 | Module 3 | Module 4 | Module 5 | Module 6 | Module 7 |
| --- | --- | --- | --- | --- | --- | --- | --- |
| R1A | R1_1 | R1_2 | R1_3 | R1_4 | R1_1 | R1_3 | R1_2 |
| R1B | R1_2 | R1_3 | R1_4 | R1_1 | R1_3 | R1_2 | R1_4 |
| R1C | R1_3 | R1_4 | R1_1 | R1_2 | R1_4 | R1_1 | R1_3 |
| R1D | R1_4 | R1_1 | R1_2 | R1_3 | R1_2 | R1_4 | R1_1 |

Accordingly, if an unexpected value is found for the presumed resistor R1 during the sequencing among the cells within a given module, there is a fault within the module. Moreover, if four unique values are found within a module, but the values not in the expected order, an incorrect module has been selected. Using more than the minimum of two unique resistor values in this case allows for increased diagnostic ability in determining what the failure may be. The embodiment described and illustrated above can check if the select lines from the CPU are stuck high or low by ensuring that the correct balancing ratios are detected in the correct order in each module. By taking a reading with no bank selected, it can be ensured that none of the enable lines to any module are stuck high. If any enable line to any of the modules is faulted low, 0 V readings will be made when that module is selected, and this condition will accordingly also be detected. Within each module, failures of the multiplexers, or the S1/S2 select signals are detected using the balancing ratios. Finally, any channel with balancing stuck on or off is detected. By using the disclosed methods, control signals which are faulted high or low or stuck together, module enable lines faulted high or low, multiplexer select lines faulted high or low or stuck together, or balancing faulted on or off is detected for this circuit.

Adjacent Cells

In some cases, a current or voltage applied to one cell may affect the measurement for an adjacent cell. For example, if a cell is stuck balancing, such that current is continually applied to the cell, the voltage measurement for the adjacent cell may be affected. For example, a current provided through the series combination of the resistor and cell would create a voltage drop across the resistor, which changes the voltage measured at the adjacent cell, as the measurement is made across the shared resistor. If a cell is stuck balancing, the voltage that is measured for the adjacent cell may be lower than the true voltage of the cell, due to the voltage drop across the resistor.

The above can be used when making measurements to determine information regarding the cells. As discussed above, measurements may be made for a cell with balancing turned on and with balancing turned off. The voltage measured with balancing turned on should be different than the measurement made with balancing turned on, due to the voltage drop across the resistor. If they are the same, then balancing for the cell is either stuck on or stuck off. If the voltage difference between the measurement with balancing on and balancing off has the wrong sign (i.e., the ratio between the two is >1), this may be due to an adjacent cell that is stuck balancing. If the ratio is less than one, but the ratio is too high, two cells may be inadvertently measured at the same time or the wrong channel may be selected. If the ratio is too low, the wrong channel may have been selected or there may be high sense resistance Rs in the connection to the measurement circuit (shown in FIG. 5).

Measurement of and Compensation for Sense Resistance

In some embodiments, the measurement system 4 may be configured to measure the sense resistance(s) Rs for a connection. Measuring the sense resistance Rs may assist in identifying a sense resistance that is too high, for example, or may enable taking into account the sense resistance when checking measurements for the cell.

Refer to FIG. 5, Cell 4. If the cell has no source resistance, the measured voltage with balancing=Voltage without balancing−R1D*(Voltage without balancing−Transistor Drop)/(R1D+R2D)

Now, if there is resistance in the cell, or the cell wiring, it can be shown that the equation changes to:

the measured voltage with balancing=Voltage without balancing−(R1D+Sense resistance)*(Voltage without balancing−Transistor Drop)/(R1D+R2D+Sense Resistance)

If other quantities are well known, the sense resistance can be calculated.

In some embodiments, a wetting current may be applied to the connections between the measuring system 4 and the measurement points to reduce the sense resistance. For example, such a wetting current may be applied by the balancing system 6. Such a current may be applied to reduce the sense resistance when it is determined that the sense resistance is too high.

Time Rate of Change Measurements

In some embodiments, measurements may be made of the voltage of a cell over time as the cell is charging or discharging. Making measurements of the voltage of a cell as the voltage changes can provide information regarding the state of charge (SOC) for the cell.

Figure 7:
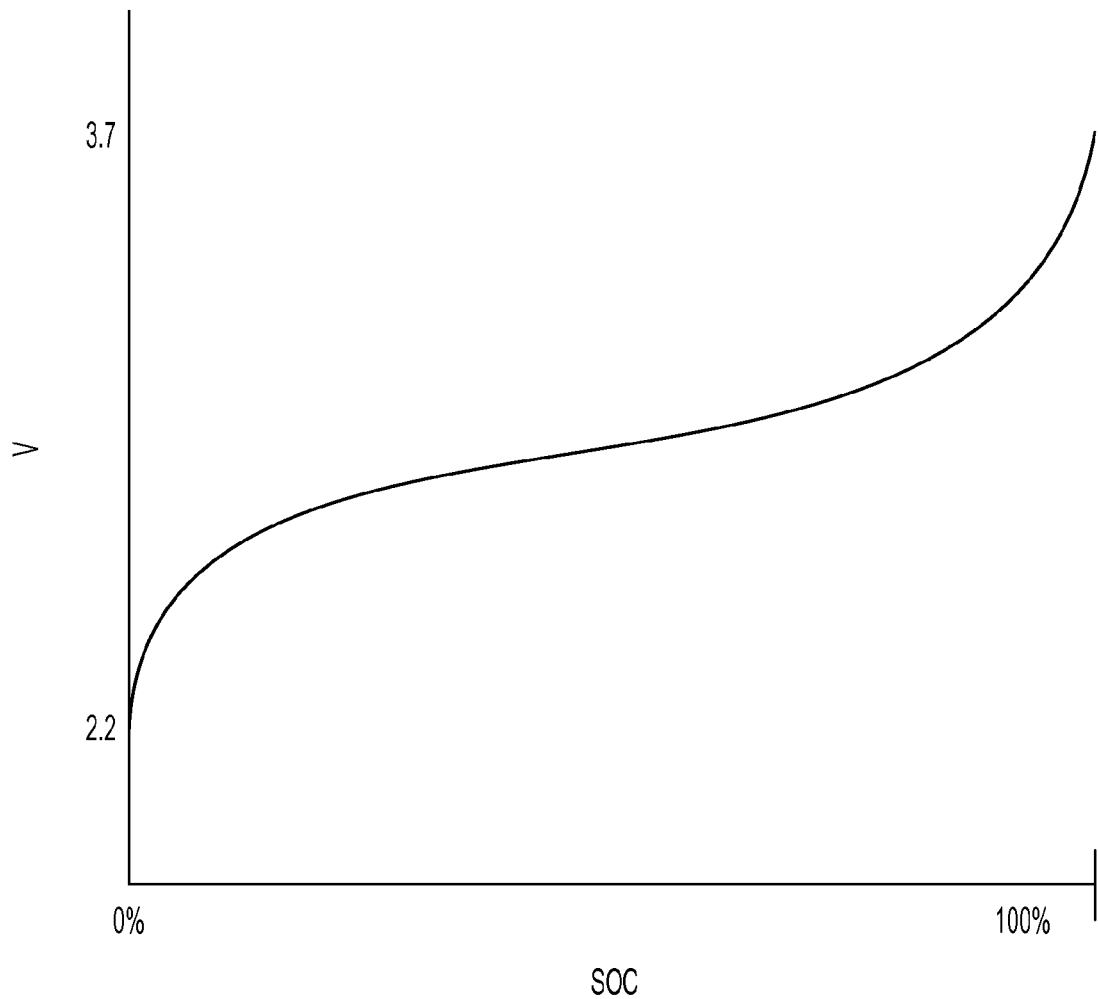
FIG. 7 shows an exemplary plot of cell voltage vs. state of charge (SOC).

FIG. 7 illustrates an exemplary plot of cell voltage vs. state of charge, which is the percentage of charge stored in the cell relative to its charge storage capacity. As shown in FIG. 7, the change in voltage is steeper at the upper and lower extremes of SOC, and less steep at moderate SOC values. In other words, when a cell is discharging or charging, the voltage of the cell will change more rapidly (for a given current) when the SOC is either a low SOC value or a high SOC value. By making measurements over time as the cell is charging or discharging, it can be determined whether the cell has a moderate SOC, or an SOC closer to the extremes. This information can be helpful in various circumstances. For example, if the measurement system has both an accurate measurement unit and a less accurate back-up, time rate of change measurements may be useful if the accurate measurement unit fails. If only a coarse measurement is available, time rate of change measurements can be useful to determine whether the cell has a moderate SOC or a more extreme SOC.

The ability to use rate of change with a coarse measurement to determine SOC can be used to distinguish a channel with balancing stuck on from a channel with balancing stuck off. If balancing is stuck on, the measurement will be consistently low. If balancing is stuck off, the measurement will be accurate. If it is not known whether balancing is stuck on or off, the measurement that results could be inaccurate. Using time rates of change can allow the system to determine whether the SOC is high or low which can then allow the system to determine if the voltage measured is accurate (and therefore balancing is stuck off), or if it is too low (and therefore balancing is stuck on).

Further Discussion

By putting resistors into a battery measuring and balancing circuit, and by measuring the voltage drop across these resistors with and without balancing enabled, with a known balancing current, the resistor value can be calculated during system operation. By ensuring unique resistor values and/or value sequences, the balancing circuit can be used to ensure that the monitoring and balancing circuits are both functioning properly on every cell. Readings with and without balancing enabled are compared, and this can be used to ensure that the correct cells are being measured and that balancing is functioning as commanded. If the balancing selection circuitry is completely independent from the monitoring selection circuitry, a single resistor value suffices to check that everything is working. Further values of R1 could help precisely locate errors for diagnostics but are not necessary. If there are shared aspects of the balancing selection and monitoring selection circuitry, multiple values of R1 are needed to ensure that no faults exist in the system. Two values of R1 suffice to detect failures of single select lines faulted stuck at logic one, or faulted stuck at logic zero. If the failures are more complex (for example select lines stuck together), more values of R1 can be used and distributed such that for any given failure, the self check results would be different for that failure versus a fully functioning system.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

For example, embodiments of controllers, such as controller 62, may be implemented using hardware, software or a combination thereof. When implemented in software, the software code can be executed on any suitable hardware processor or collection of hardware processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed to perform the functions recited above.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Note that the actual embodiment may be realized using discrete electronics, integrated circuits or the construction of the most or all of the entire system on a single application-specific integrated circuit (ASIC) specifically for this application.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A system for monitoring and balancing electrochemical cells of a pack, the system comprising:
a balancing circuit configured to charge or discharge a first electrochemical cell of the pack, the balancing circuit being configured to generate a current through the first electrochemical cell; and
a measurement circuit connected to the first electrochemical cell, the measurement circuit being configured to measure, based on the current, a sense resistance established by coupling the measurement circuit to the first electrochemical cell, wherein the sense resistance comprises a contact resistance established by coupling the measurement circuit to the first electrochemical cell, wherein the balancing circuit is configured to generate a wetting current through the first electrochemical cell of sufficient magnitude to wet a contact between conductors coupling the measurement circuit to the first electrochemical cell, and wherein the system is configured to:
- determine whether the sense resistance exceeds a threshold; and
- control the balancing circuit to generate the wetting current through the first electrochemical cell when the sense resistance exceeds the threshold.

2. A system for monitoring electrochemical cells of a pack, the system comprising:

a measurement circuit connected to a first electrochemical cell of the pack; and a current generating circuit configured to generate a wetting current through the first electrochemical cell of sufficient magnitude to wet a contact between conductors coupling the measurement circuit to the first electrochemical cell, wherein the system is configured to:
- determine whether a sense resistance established by coupling the measurement circuit to the first electrochemical cell exceeds a threshold; and
- control the balancing circuit to generate the wetting current through the first electrochemical cell when the sense resistance exceeds the threshold.

* * * * *